United States Patent [19]

Matsumura et al.

[11] Patent Number: 5,034,854

[45] Date of Patent: Jul. 23, 1991

[54] ENCASED TRANSFORMER

[75] Inventors: Katsumi Matsumura; Yutaka Hirooka; Masayoshi Matsuda; Kazunari Ishikawa, all of Toyooka; Yoshihiro Kuniya, Hyogo, all of Japan

[73] Assignee: Matsushita Electric Industrial Co., Ltd., Kadoma, Japan

[21] Appl. No.: 529,915

[22] Filed: May 29, 1990

[30] Foreign Application Priority Data

| | | | |
|---|---|---|---|
| Jun. 1, 1989 | [JP] | Japan | 1-140481 |
| Oct. 2, 1989 | [JP] | Japan | 1-257359 |
| Feb. 14, 1990 | [JP] | Japan | 2-34306 |

[51] Int. Cl.⁵ .................... H05K 1/16; H01F 27/04; H01F 15/10

[52] U.S. Cl. .................... 361/396; 336/92; 336/96; 336/192; 361/405

[58] Field of Search .................... 336/65, 92, 96, 192, 336/198, 208; 361/405, 395, 396

[56] References Cited

U.S. PATENT DOCUMENTS

| | | | |
|---|---|---|---|
| 2,732,529 | 1/1956 | Reid et al. | 336/192 |
| 3,387,244 | 6/1968 | Davis | 336/192 |
| 3,562,903 | 2/1971 | Busler et al. | 336/192 |
| 4,626,823 | 12/1986 | Smith | 336/192 |

FOREIGN PATENT DOCUMENTS

| | | |
|---|---|---|
| 2729720 | 1/1979 | Fed. Rep. of Germany . |
| 57-164511 | 10/1982 | Japan . |
| 61-214404 | 9/1986 | Japan . |

*Primary Examiner*—Thomas J. Kozma
*Attorney, Agent, or Firm*—Ratner & Prestia

[57] ABSTRACT

An encased transformer that comprises a bobbin including a plastic-molded cylindrical portion and upper and lower collars formed respectively at upper and lower ends of the cylindrical portion, a magnetic element extending centrally through the cylindrical portion, primary and secondary coils wound round the outer periphery of the cylindrical portion, comb-shaped metals terminal formed on the pair of lower collars by insert molding, the comb-shaped portion of each metal terminal being bent at generally right angles, the metal terminals being further bent at right angles and outwardly horizontally at an end portion thereof so that the metal terminal is substantially Z-shaped, a straight portion of the metal terminal positioned midways of the Z-shaped being fixedly held in position between the inner wall of a case and a frame wall having recessed terminal grooves into which are individually fitted metal terminals provided in a plastic square bottom plate.

4 Claims, 12 Drawing Sheets

ENCASED TRANSFORMER

BACKGROUND OF THE INVENTION

1. Field of the Invention

The present invention relates to an encased transformer for use in audio equipment, video equipment, and any other electrical equipment.

2. Description of the Prior Art

In order to explain the background of the present invention, reference will be made to FIGS. 1 to 7, which illustrate a typical conventional transformer:

As shown in FIGS. 1 and 2, the transformer includes a bobbin 4 having a cylindrical portion 1 with an upper collar 2 and a lower collar 3 at its upper and lower ends, respectively. The lower collar 3 is provided with outwardly laterally oriented metal plate terminals 5*a* to 5*d* which are formed in one piece with the lower collar 3 or alternatively attached thereto after they are made by molding. Lead wires 6*a* to 6*d* of primary and secondary coils 7, 8 wound round the bobbin 4 are bent at their lower portions at a desired angle, with portions of several millimeters left for the convenience of the connection to the metal plate terminals 5*a* to 5*d* as used by the user (hereinafter referred to as "user metal terminal"), and the top ends of the lead wires 6*a* to 6*d* are outwardly bent at a desired angle so that they are positioned at the same level with the underside 3' of the lower collar 3. The primary coil 7 is wound round the cylindrical portion 1 of the bobbin 4 of the above-described construction, a lead wire 6*a* at the leading end thereof being passed through a groove 9*a* provided in the lower collar 3 for winding round the base 5*e* of the user metal terminal 5*a*. A lead wire 6*b* at the trailing end of the coil is passed through a groove 9*b* for winding round the base 5*f* of the user metal terminal 5*b*. The secondary coil 8 is wound round the primary coil 7, a lead wire 6*c* at the leading end thereof being passed through a groove 9*c* provided in a lower collar 3*b* for winding round to the base 5*g* of the user metal terminal 5*c*. A lead wire at the trailing end is connection in similar manner. The lead wire 6 wound about the user metal terminal 5 are then soldered, thereafter an E-type magnetic element 10 is incorporated vertically into the cylindrical portion 1 of the bobbin 4 and fixed in position to form a magnetic path. This is a typical conventional method for constructing transformers.

Referring to FIG. 3, the construction of a conventional encased transformer will be described:

The encased transformer also includes a cylindrical portion 1 of a bobbin 4 with an upper collar 2 and a lower collar 3 provided respectively at its upper and lowed ends. User's metal terminals 5 are implanted in the lower collar 3. The cylindrical portion 1 of the bobbin 4 have primary and secondary coils 7, 8 wound round it, and lead wires 6 of the coils 7, 8 are connected to the metal terminals 5 in corresponding relation thereto by being wound about the latter. A magnetic element 10, such as a ferrite core, is vertically inserted and fixed in position to form a magnetic path. A transformer constructed in this way is inserted into an opening of a case 11, and resin material 12, such as silicon resin, is then poured into the case. Finally, a bottom plate 13 is fitted in the opening of the case 11. The amount of the resin material 12 is adjusted to cover a substantial portion of the magnetic element 10 of the transformer, and the resin is normally set by heating.

A conventional type of encased transformer used for flat mount will be described with reference to FIGS. 4 and 5.

FIG. 4 is a sectional view of the transformer. A cylindrical portion 1 of a bobbin 4 has an upper collar 2 and a lower collar 3 formed respectively at opposite ends thereof, the lower collar 3 having metal terminals 5 inserted. A primary coil 7 and a secondary coil 8 are wound round the cylindrical portion 1 of the bobbin 4, lead wires 6 of the coils being wound around metal terminals 14 (hereinafter referred to as "maker metal terminals"). A magnetic element 10, such as a ferrite core, is inserted and fixed in position. The assembly formed in this way is placed in the case 11 and then a bottom plate 13 is inserted in position to close the opening of the case 11. The opening of the case 11 is provided with a rib 15 extending along the inner circumference of the opening, and the bottom plate 13 has a stepped portion 16 extending along the outer circumference thereof. In assembling the transformer the bottom plate 13 is forced into the opening of the case 11, and after the stepped portion 16 of the bottom plate 13 is located inside of the rib 15, the expanded opening is allowed to narrow, thereby securing the joint between the bottom plate 13 and the case 11.

When an electric circuit is to be formed by using a transformer of the above described type, it is a common practice to employ a printed board. Such a circuit of the prior art will be described with reference to FIG. 6. A printed board 17 has a circuit pattern 18 printed with copper foil or the like. A transformer 19 includes various "passive elements 20", such as inductance L, capacitor C and resistance L. Active elements 21, such as transistors, are mounted in position on the printed board 17. These components are electrically connected by soldering to the printed board 17. In this way, it has been usual to have electronic parts mounted peripherally of the transformer 19 on the printed board 17. FIG. 7 is a circuit diagram showing an embodiment of FIG. 6.

Transformers of this type find many applications. For example, they are employed in electronic apparatus, such as video cameras, telephone sets, and liquid crystal TV sets. In these applications, the transformers are required to have a structure adapted for attachment on the surfaces of printed boards because of the trend toward sophisticated functions and increased versatilities of light weight and small size. On the other hand, the conditions under which transformers are used are becoming more severe than ever. For example, they are subjected to thermal stresses due to reflow soldering, and mechanical loads exerted by supersonic wave cleaning after soldering. These external stresses may break the lead wires of the transformer and/or crack the ferrite core, thus eventually breaking the transformer. This problem will be more particularly described with reference to FIG. 2:

The metal plate terminals 5*a*, 5*b* of the transformer are attached to the printed board 17. When any load is accidentally applied to the transformer in the vertical directions 22*a* and 22*b*, the transformer is actually subjected to a lift upward, that is, in the vertical direction 22*a* because the base portions thereof are secured to the printed board 17. In contrast, the bases 5*e*, 5*f*, 5*g*, 5*h* of the metal terminals 5*a*, 5*b*, 5*c*, 5*d* around which lead wires 6*a*, 6*b*, 6*c*, 6*d* are wound are subjected to a downward pressure together with the printed board 17 in the downward direction 22*b*. In this way, the lead wire 6*a*, 6b, are pulled both upward and downward, thereby causing the lead wires 6a and 6d to break. Likewise, when any load is applied laterally in the directions 23a and 23b, the breakage of the lead wires 6a to 6d to occur.

Another problem is that the metal terminals 5 are easy to deform, even by a relatively light load applied to their front ends, thereby decreasing the dimensional precision. This problem derives from the fact that the entire length of each of the metal terminals 5a, 5b, is the sum of the length of each of the portions 5a, 5f, about which the lead wires 6 are wound, and the length of each of the bent potions.

A further problem derives from the reflow soldering. More specifically, when the resin cast transformer shown in FIG. 3 is to be reflow-soldered, the components are subjected to thermal stress. The problem arises during the stage of reflow soldering, in which the temperature within the reflow furnace reaches 230° C. As is common with the reflow soldering process, preheating is carried out at 150° C. for one to two minutes, and then the temperature of the furnace is maintained at more than 200° C. for about 30 seconds. The components of the transformers are subjected to such a high temperature treatment, which unfavorably affects the transformers. For example, the primary and secondary coils 7, 8, the magnetic element 10, and the casting resin material 12 are elongated or expanded. However, since they have different coefficients of thermal expansion, the degree of expansion of the magnetic element 10, such as ferrite core, is different from that of the casting resin material 12. Generally, the casting resin material 12 has a hardness of 50 or more, and a greater expandability. Therefore, the problem is that the casting resin material 12 positioned between the bobbin 4 and the magnetic element 10, such as ferrite core, is likely to expand outwardly so that the expanding force breaks the magnetic element 10.

In a transformer of the type shown in FIG. 4, the bottom plate 13 is merely inserted in the case 11, thereby failing to achieve a strong joint therebetween. In addition, gaps are likely to be produced between the bottom of the metal terminals 5 and the bottom of the case 11 and/or the bottom of the bottom plate 13. It may happen that the metal terminals 5 are detrimentally raised relative to the bottom of the transformer. As shown in FIG. 5, the transformer having such a deficiency is mounted on the printed board 17, a gap T is created between the printed board 17 and the metal terminals 5 of the transformer, which prevents an improper soldering connection. The improper connection results in electrical conduction.

When circuits are to be constructed with the above-mentioned conventional transformer, the common practice is to mount the transformer 19 and other components on the printed board 17 as shown in FIG. 6. This practice has a drawback in that a space sufficient for mounting other components than the body of the transformer 19 is required, thereby preventing the achievement of compact-size apparatus.

SUMMARY OF THE INVENTION

The encased transformer of this invention, which overcomes the above-discussed and numerous other disadvantages and deficiencies of the prior art, comprises a bobbin including a plastic-molded cylindrical portion and upper and lower collars formed respectively at the upper and lower ends of the cylindrical portion, a magnetic element extending centrally through the cylindrical portion, primary and secondary coils wound round the outer periphery of the cylindrical portion, comb-shaped terminals each having a substantially U-shaped portion with first and second legs formed on the pair of lower collars by insert molding, the the first and second legs being bent at generally right angles, the first legs each being further bent at right angles and outwardly horizontally at an end portion in a substantially Z-shape, a straight portion positioned midway of the Z-shape end portion being fixedly held in position between an inner wall of a case and a frame wall having recessed terminal grooves into which are individually fitted said Z-shape end portion and said frame wall mounted on a plastic square bottom plate.

In a preferred embodiment, the body of the transformer is inserted in the case, the transformer body comprising a bobbin having primary and secondary coils wound round it and a magnetic element extending centrally therethrough, and wherein a resin having a low degree of hardness of from 20 to 50 (JIS K6301), such as silicone resin, is loaded into the case so that the transformer body is partially or entirely embedded in the resin, the bottom plate being fitted in position through an opening of the case.

In another preferred embodiment, the transformer body is inserted into a case provided with an undercut portion in its interior, a bottom plate formed with an engaging projection being fitted in position so that the engaging projection goes into engagement with the undercut portion of the case, and wherein the size of the bottom plate is equal to or larger than the size of the opening of the case, the case being positioned on the bottom plate, and the underside of the bottom plate being flush with the bottom of the user metal terminal of the transformer body.

In a further preferred embodiment, the bottom plate has an electronic circuit formed by various electronic parts thereon, the bottom plate being fitted in position so that the electronic circuit is positioned within the opening of the case, the circuit thereby being electrically connected to the terminals of the transformer body.

Thus, the invention described herein makes possible the objectives of (1) providing an encased transformer capable of withstanding physical and thermal stresses, (2) providing an encased transformer securing the stable mount of metal terminals to the printed board, and (3) providing an encased transformer of compact-size with operational reliability.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

Figure 11A:
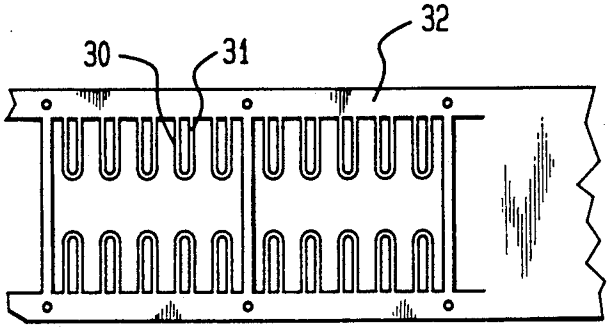
FIGS. 11*a* to 11*c* are top plan views showing metal terminals employed in the encased transformer according to the present invention.
Figure 11B:
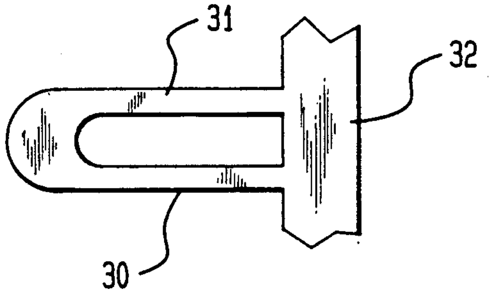
Figure 11C:
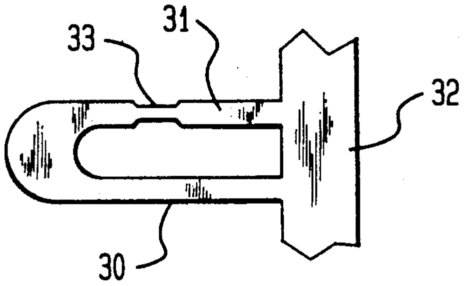

One embodiment of the invention will now be described with reference to FIGS. 8 to 17, inclusive. Referring to FIG. 11, a metal terminal to be attached to a bobbin will be described:

User metal terminals 30 and maker metal terminals 31 are made in one piece so that each pair of these terminals 30 and 31 are connected at their lead wires to form a U-shaped configuration as shown in FIGS. 11*a* to 11*c*. The U-shaped terminals are made in one piece with a hoop member 32. In order to enable the user to secure the firm joint between the metal terminals and a printed board, the metal terminals may be shaped so that, as FIG. 11*b* shows, each user metal terminal 30 is wider than each maker metal terminal 31. In order to secure the lead wire on the terminals 31, the terminals 31 may be provided with a notch 33, as shown in FIG. 11*c*. In this way the bobbin 34 is fabricated with the insertion of the U-shaped metal terminal in on a lower collar 35 thereof.

Figure 1:
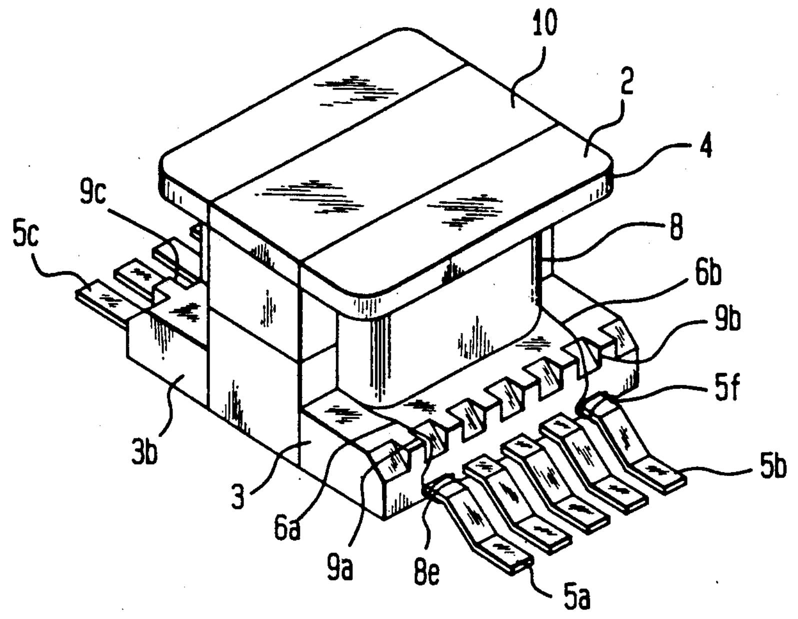
FIG. 1 (PRIOR ART)
FIG. 1 is a perspective view of a conventional transformer.
Figure 2:
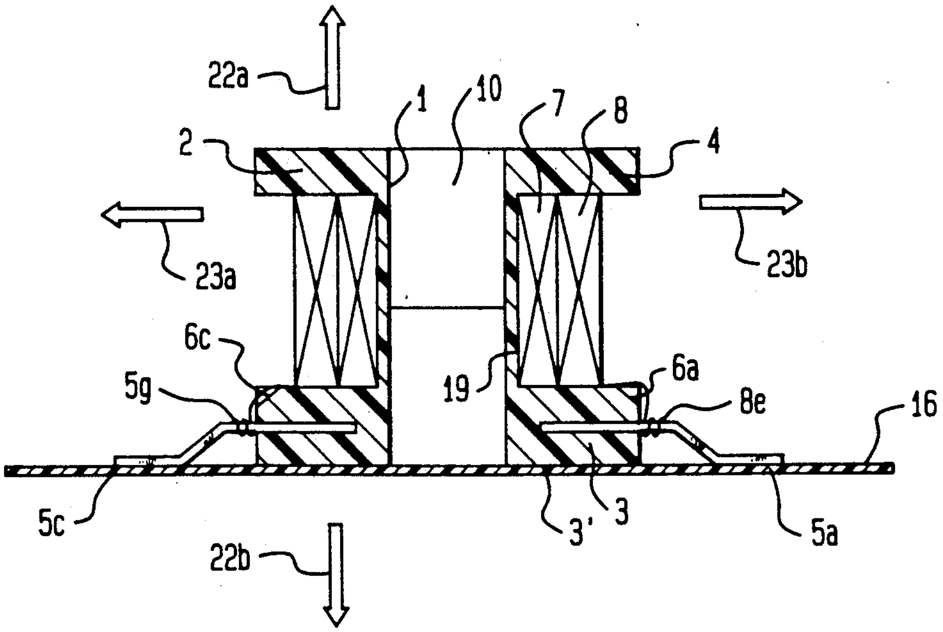
FIG. 2 (PRIOR ART)
FIG. 2 is a sectional view thereof.
Figure 3:
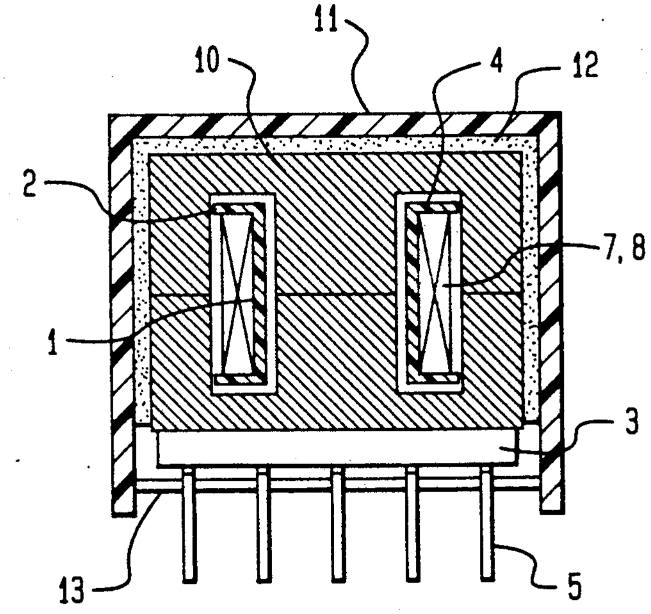
FIG. 3 (PRIOR ART)
FIG. 3 is a sectional view showing a conventional resin-cast type transformer.
Figure 4:
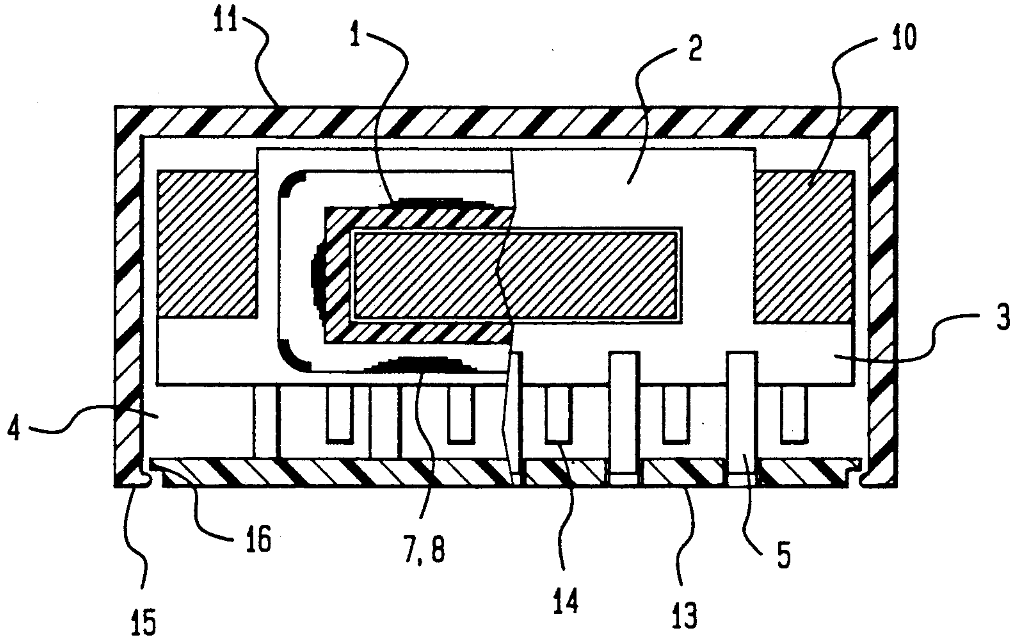
FIG. 4 (PRIOR ART)
FIG. 4 is a sectional view showing a conventional encased transformer.
Figure 5:
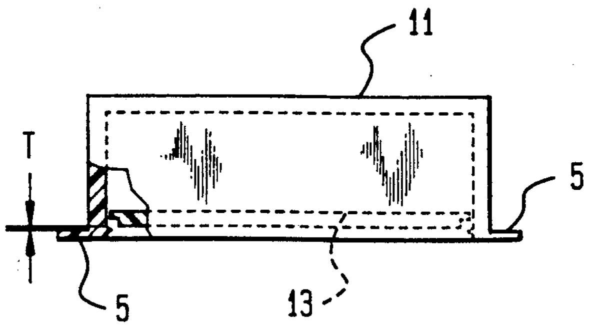
FIG. 5 (PRIOR ART)
FIG. 5 is a side view thereof.
Figure 6:
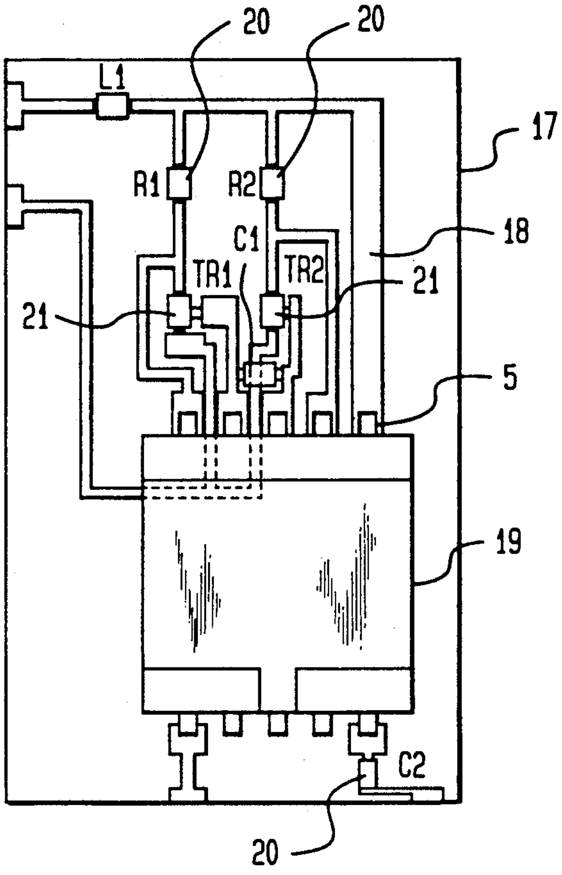
FIG. 6 (PRIOR ART)
FIG. 6 is a top plan view showing an electronic circuit formed on a printed board which incorporates a transformer therein.
Figure 7:
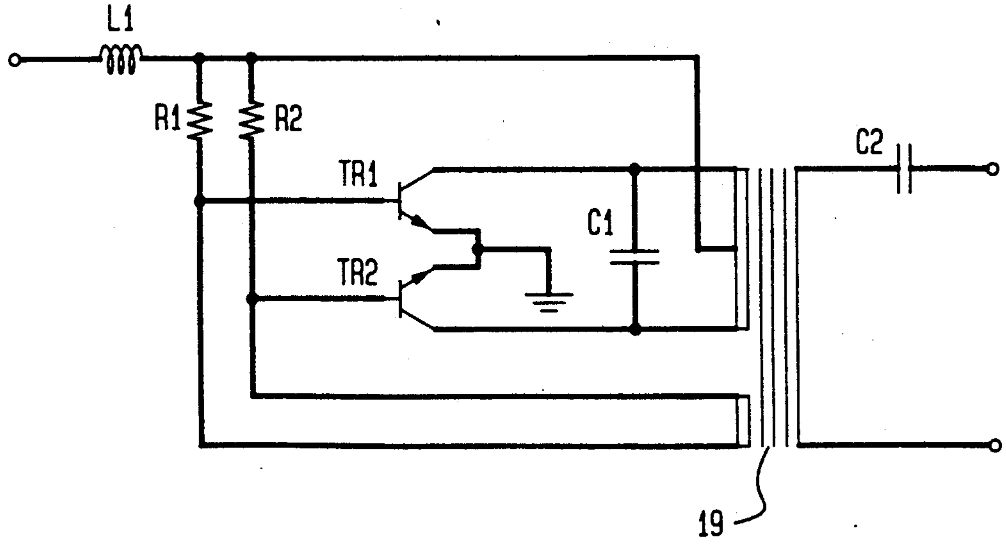
FIG. 7 (PRIOR ART)
FIG. 7 is a circuit diagram for the electronic circuit.
Figure 8:
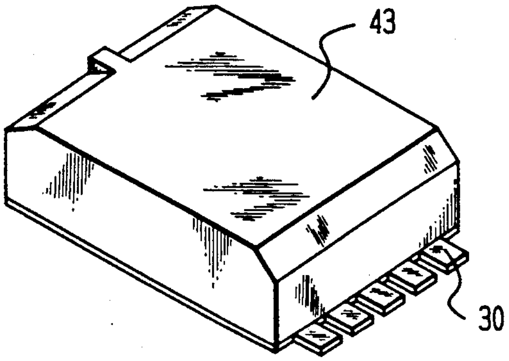
FIG. 8 is a perspective view showing one embodiment of the encased transformer according to the invention.
Figure 9:
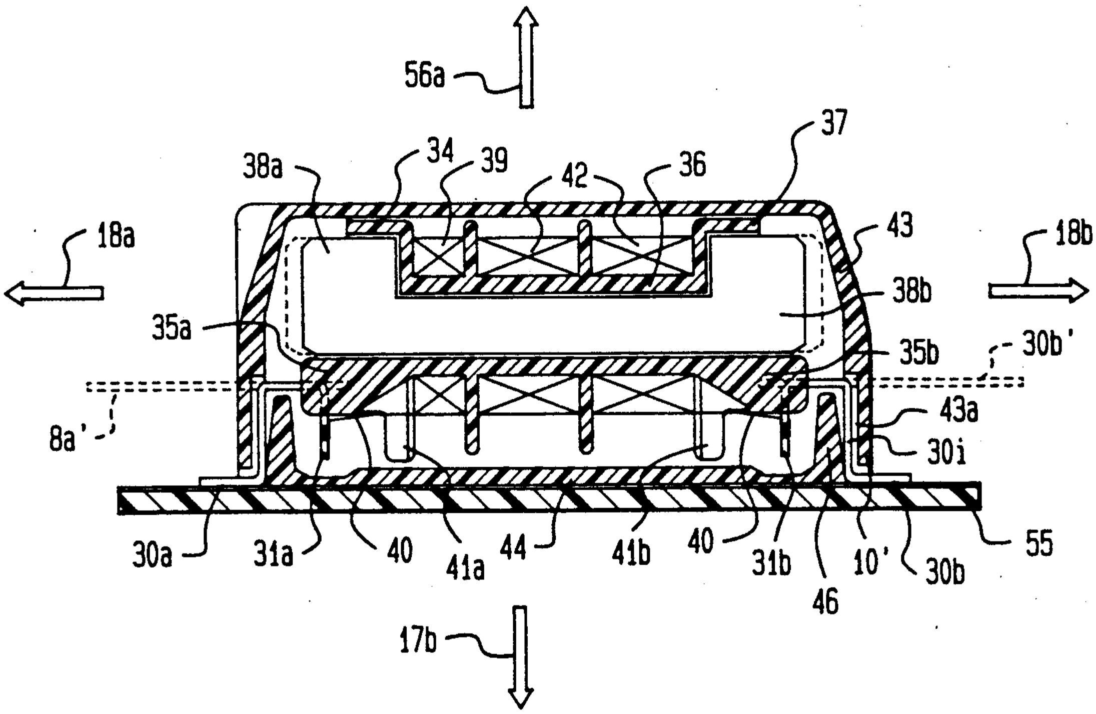
FIG. 9 is a sectional view in side elevation thereof.

Referring to FIG. 9, the bobbin 34 will be described in detail:

The bobbin 34 includes a cylindrical portion 36 made of plastic material, and an upper collar 37 and lower collars 35*a*, 35*b* formed at opposite ends of the cylindrical portion 36. The lower collars 35*a* and 35*b* are formed by the insert molding method. The metal terminals 30*a*, 30*b*, 31*a*, 31*b* each have a substantially U-shape and comb-shaped configuration as already described, and are in parallel with the direction in which magnetic elements 38*a*, 38*b* are inserted. During the stage of insert molding, both the user metal terminals 30*a* and the maker metal terminals are in a continuous hoop form; and before the lead wires 40 are wound, the bobbins are individually separated. A predetermined length of the maker metal terminals 31 remains uncut so as to facilitate the connection thereof to other devices because of the portion left uncut by a predetermined length. Then, the metal terminals 31 are bent downward at right angles, so as to form maker metal terminals 31*a*, 31*b*. The lower collars 35*a*, 35*b* are respectively formed with grooves 41*a* for passage of lead wires 40 of a primary coil 39 and grooves 41*b* for passage of lead wires 40 of a secondary coil 42.

Figure 10A:
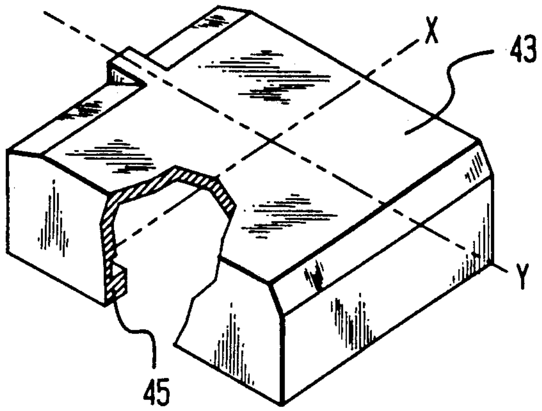
FIGS. 10*a* to 10*c* are schematic views showing the steps of assembling the encased transformer according to the present invention.
Figure 10B:
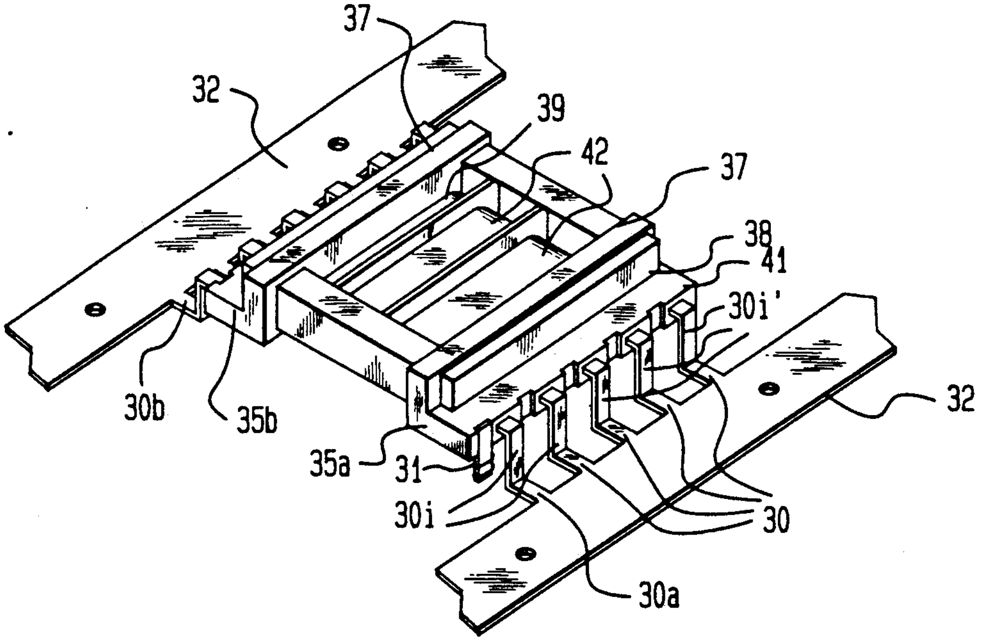
Figure 10C:
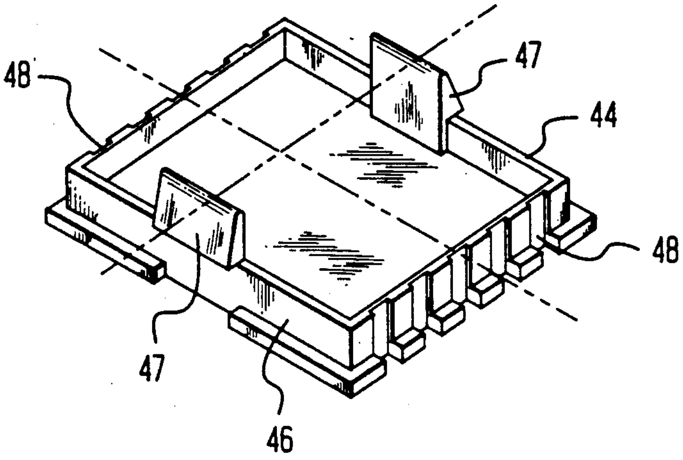

Referring to FIG. 10, a case 43 and of a bottom plate 44 will be described:

The case 43, made of plastic and being open at one side, is provided with a pair of undercut portions 45 on its inside wall in the direction of X. The bottom plate 44 is also made of plastic, and has a square frame wall 46 of several millimeters in height formed on its upper surface. The frame wall 46 is provided with a pair of engaging projections 47 for engagement with the undercut portions 45 facing in the directions of X, and with a plurality of terminal grooves 48 facing in the directions of Y.

Referring to FIG. 9, the method of assembling the transformer will be described:

The primary coil 39 is wound round the cylindrical portion 36 of the bobbin 34, and lead wires 40 are passed through the grooves 41*a* for winding round the maker metal terminals 31*a*. Similarly, the secondary coil 42 is wound round the cylindrical portion 36, and lead wires 40 are passed through the grooves 41*b* for winding round the maker metal terminals 31*b*. The lead wires 40 are soldered to the portions round which it is wound.

Subsequently, an E-type magnetic element 38*a* is inserted in the cylindrical portion 36 from one side thereof, and then an I-type magnetic element 38*b* is inserted therein from the opposite side thereof. The magnetic elements 38*a* and 38*b* are joined such as by adhesive. Instead of the I-type magnetic element 38, two E-type magnetic elements 38*a* and 38*b* can be used in combination. Then, the user metal terminals 30 assembled in this way is appropriately shaped. Referring to FIG. 9, the shaping process of the metal terminals 30 will be described:

The user metal terminals 30*a* and 30*b* horizontally projecting from sides of the bobbin 34 are bent downward except a specified length thereof measured from the side ends of the lower collars 35, and other portions than a portion 30*i* of the metal terminal 30 are bent outwardly in the sideways direction. In this way the shaping process is completed.

The body of the transformer is inserted into a plastic case 43 as shown in FIG. 10. The straight portions 30*i* of the user metal terminals 30 are held in abutment with the inner side wall 43*a* of the case 43. Then, the bottom plate 44 is fitted in position so that the projections 47 and square frame walls 46 provided on the bottom plate 44 are positioned in the case 43, whereupon the undercut portions 45 formed on the inner side walls of the case 43 are engaged by the engaging projections 47 formed on the bottom plate 44. That is, respective catching portions of the engaging projections 47 are sized larger than the interior of the undercut portions 45 formed in the inner wall of the case 43, whereby the engaging projections 47 of the bottom plate 44 are mechanically brought into a secure engagement with the undercut portions 45 of the case 43. The square frame walls 46 having terminal grooves 48 are intended to house the straight portions 30*i* formed by downwardly bending the user metal terminals 30, therefore the straight portions 30*i* are sandwiched between the inner side wall 43*a* of the case 43 and the square frame walls 46 of the bottom plate 44, thus being fixed in position.

The user metal terminals 30*a* and 30*b* assembled in this way, together with the hoop members 32, are cut to provide a specified length for each.

Referring to FIG. 9, a further description is as follows:

After the user metal terminals 30*a* and 30*b* of the encased transformer are soldered to the printed board 55, the transformer is subjected to a load whereby it becomes separated from the printed board 55 in response to any upward force acting thereon, and the metal terminals 30*a* and 30*b* are subjected to a peeling urge. However, because the straight portions 30*i* of the user metal terminals 30*a* and 30*b* are sandwiched between the inner side wall 43*a* of the case 43 and the square frame walls 46 of the bottom plate 44, any load transmitted from the user metal terminals 30*a*, 30*b* are absorbed by the portion sandwiched between the square frame walls 46 of the bottom plate 44 and the inner side wall 43*a* of the case 43 and, therefore, such loads are not transmitted to the lower collars 35*a*, 35*b* of the bobbin 34. Thus, the bobbin 34 has no possibility of breakage. There is no possible breaking either with respect to the lead wires 40 of the primary and secondary coils 39, 42 which are wound round the maker metal terminals 31*a*, 31*b*. A similar effect is obtained against any lateral load, there being no possible breaking of the lead wires 40 or bobbin 34 due to such load.

Figure 12:
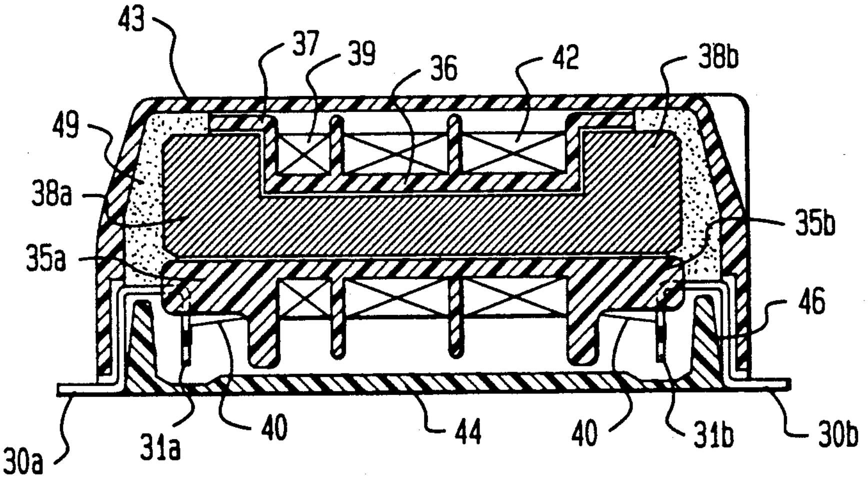
FIG. 12 is a sectional view showing an encased transformer representing an embodiment in which a relatively soft casting resin is used.

Referring to FIG. 12, a resin cast encased transformer will be described:

As described in the beginning, the magnetic elements 38*a*, 38*b* are incorporated in the bobbin 34 with the primary and secondary coils 39, 42, and then the transformer body is inserted into a plastic case 43 which is open at one end. In this case, a resin material 49 having a low degree of hardness, such as silicone resin, is filled in the case 43 until the body of the transformer is partly or wholly buried therein, and then the resin is set. Preferably, the soft resins have a hardness of 10 to 50 (JIS K6301), most preferably of about 30. The stretch of the resin material 49 is preferably of the order of not larger than 150%, preferably of about 120%.

Figure 13:
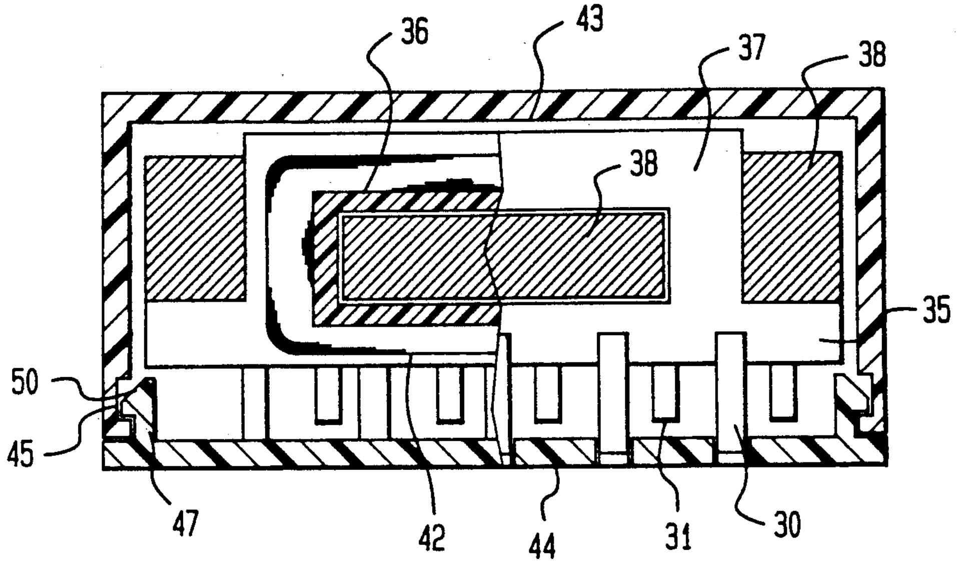
FIG. 13 is a sectional view of an encased transformer in which the case rests on the bottom plate.
Figure 14:
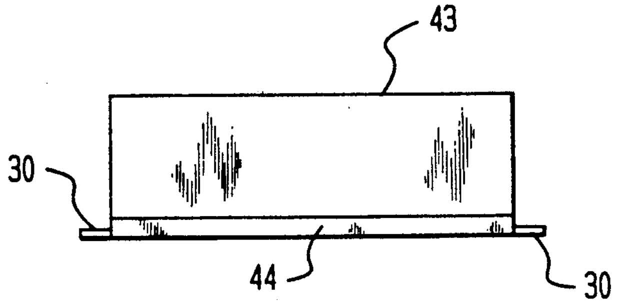
FIG. 14 is a side view thereof.
Figure 15:
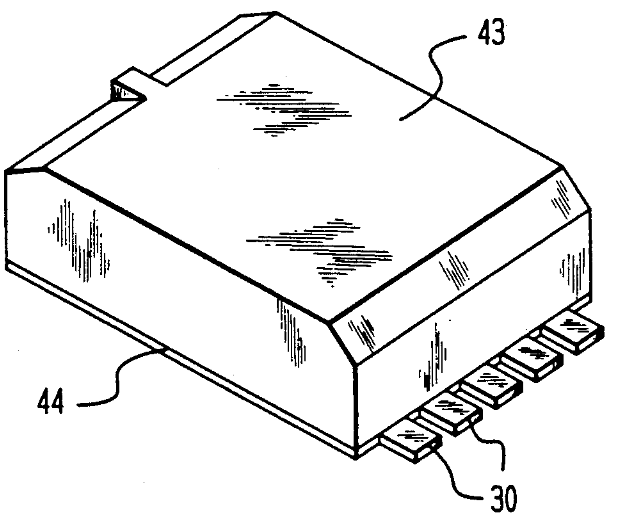
FIG. 15 is a perspective view showing a modified version of encased transformer.
Figure 16:
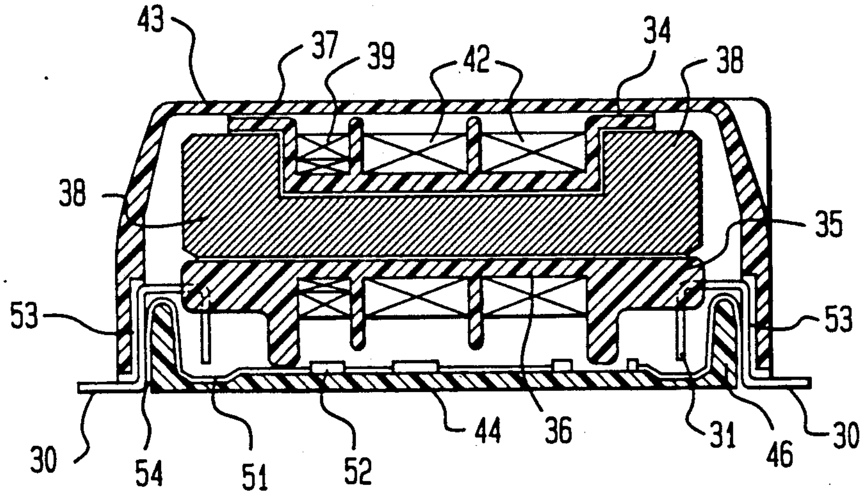
FIG. 16 is a sectional view thereof.
Figure 17A:
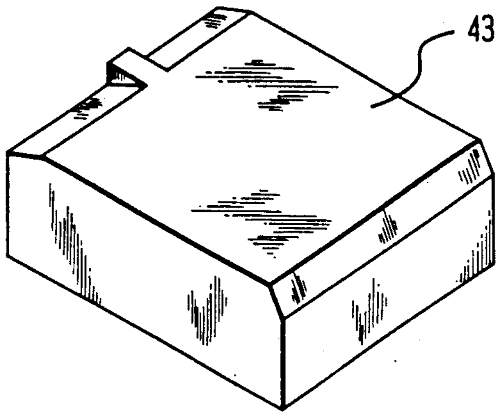
FIGS. 17*a* to 17*c* are schematic views showing the steps of assembling the encased transformer of FIG. 15.
Figure 17B:
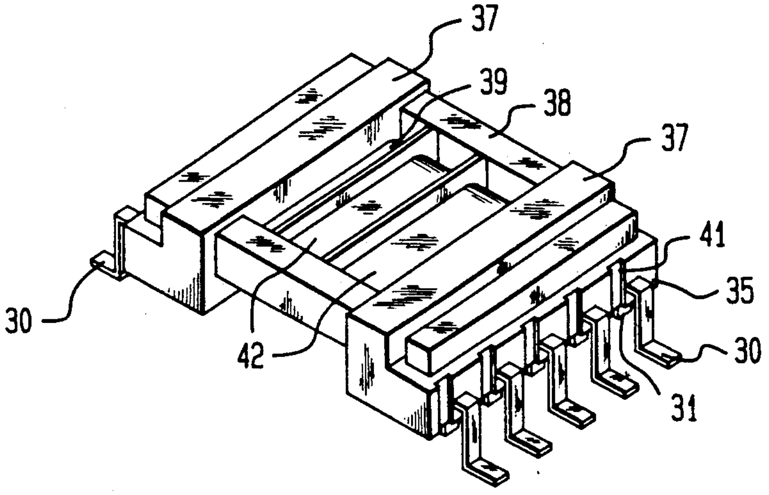
Figure 17C:
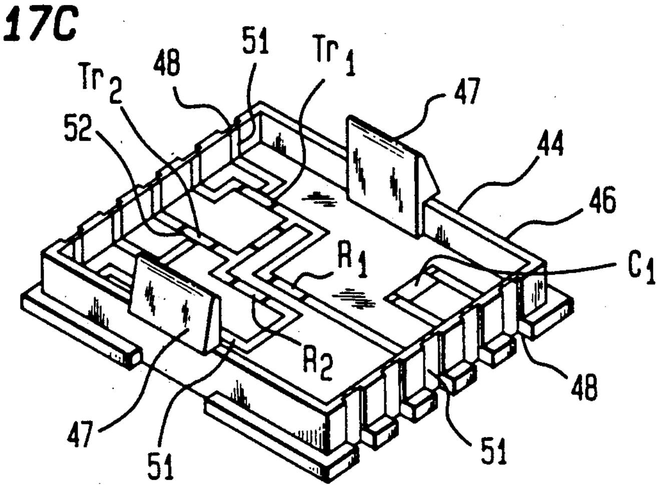

Referring to FIGS. 13 and 14, the construction of the above mentioned plastic case 43 and bottom plate 44 will be described:

After the transformer is inserted into the case 43, the bottom plate 44 is fitted and fixed to the case 43. The opening of the case 43 is smaller in size than the bottom plate 44 so that the opening end of the case 43 can be mounted on the bottom plate 44. Therefore, when the transformer of the invention is to be mounted on a printed board, the bottom plate 44 and the user metal terminals 30 are in contact with the printed board. For the purpose of fitting, the inside wall of the case 43 is provided with undercut portions 45 adjacent to the open end of the case 43, and the bottom plate 44 is provided with engaging projections 47 so that the undercut portions 45 are engaged by convex portions 50 of the projections 47.

The inside wall of the bottom plate 44 is provided with circuit patterns 51 with the use of copper foil, with the part of it coated with photo-resist. In addition, electronic components 52 having inductance L, capacitor C and resistance R are added. Instead of forming the circuit patterns on the inside wall of the bottom plate 44, a flexible substrate having circuit patterns can be mounted on the bottom plate 44. A transformer incorporating a magnetic element 38 is inserted into the case 43 and then the bottom plate 44 incorporating an electronic circuit is fitted in the case 43. In this way a transformer incorporating an electronic circuit is constructed. For connection between the user metal terminals 30 and the circuit patterns 51, it is arranged that inverted U-shaped terminal grooves 48 formed on the bottom plate 44 are provided with a printed circuit pattern 51 as a portion of the circuit pattern 51, the partial circuit pattern 51 being coated with a solder cream or the like, which will be heated after the assembly operation, whereby a connection 54 between the metal terminal 30 and the circuit pattern 51 can be formed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An encased transformer comprising a bobbin including a plastic-molded cylindrical portion and upper and lower collars formed respectively at upper and lower ends of the cylindrical portion, a magnetic element extending centrally through the cylindrical portion, primary and secondary coils wound round the outer periphery of the cylindrical portion, comb-shaped metal terminals formed on the pair of lower collars by inert molding, the comb-shaped terminals each having a substantially U-shaped portion with first and second legs being bent at generally right angles, the first legs each being further bent at right angles and outwardly horizontally at an end portion in a substantially Z-shape, a straight portion positioned midway of the z-shape end portion being fixedly held in position between an inner wall of a case and a frame wall having recessed terminal grooves into which are individually fitted said Z-shape end portion and said frame wall mounted on a plastic square bottom plate.

2. An encased transformer according to claim 1, wherein said bobbin, magnetic elements and coils are embedded, at least in part, in a resin having a degree of hardness of from 20 to 50, the bottom plate being fitted in position through an opening of the case.

3. An encased transformer according to claim 1, wherein the case is provided with an undercut portion in its interior, said bottom plate formed with an engaging projection being fitted in position so that the engaging projection goes into engagement with the undercut portion of the case, and wherein the size of the bottom plate is at least as large as the size of the opening of the case, the case being positioned on the bottom plate, and the underside of the bottom plate being flush with the bottom of the Z-shape end portion.

4. An encased transformer according to claim 1, wherein the bottom plate has an electronic circuit formed by various electronic parts thereon, the bottom plate being fitted in position so that the electronic circuit is positioned with the opening of the case, the circuit being thereby electrically connected to the comb-shaped terminals.

* * * * *